(12) United States Patent
Chung

(10) Patent No.: US 8,292,671 B2
(45) Date of Patent: Oct. 23, 2012

(54) CONNECTOR

(75) Inventor: Hsuan-Ho Chung, Bade (TW)

(73) Assignee: Dnova Corporation, Taipei (TW)

( * ) Notice: Subject to any disclaimer, the term of this patent is extended or adjusted under 35 U.S.C. 154(b) by 366 days.

(21) Appl. No.: 12/624,929

(22) Filed: Nov. 24, 2009

(65) Prior Publication Data

US 2011/0124237 A1  May 26, 2011

(51) Int. Cl.
*H01R 24/00* (2011.01)

(52) U.S. Cl. .......................... 439/660; 439/946

(58) Field of Classification Search .......... 439/660, 439/76.1, 964, 79
See application file for complete search history.

(56) References Cited

U.S. PATENT DOCUMENTS

| | | | | |
|---|---|---|---|---|
| 6,854,984 | B1 * | 2/2005 | Lee et al. | 439/79 |
| 7,104,848 | B1 * | 9/2006 | Chou et al. | 439/660 |
| 7,165,998 | B2 * | 1/2007 | Lee et al. | 439/660 |
| 7,517,253 | B1 * | 4/2009 | Chiang | 439/660 |
| 7,563,140 | B1 * | 7/2009 | Wan et al. | 439/660 |
| 7,850,465 | B1 * | 12/2010 | Wan et al. | 439/79 |
| 7,988,460 | B1 * | 8/2011 | Chiu et al. | 439/76.1 |
| 2010/0304611 | A1 * | 12/2010 | He et al. | 439/607.01 |

* cited by examiner

*Primary Examiner* — Xuong Chung Trans
(74) *Attorney, Agent, or Firm* — Leong C. Lei

(57) ABSTRACT

The present invention relates to a connector, which includes a printed circuit tongue, and one surface of the printed circuit tongue is defined with a plurality of first printed areas and second printed areas which are joined to terminals. Elastic terminal pieces extend from the first printed areas and assembled on the printed circuit tongue, and third printed areas similarly extend from the second printed areas and defined on the printed circuit tongue. Moreover, fourth printed areas are defined on another surface of the printed circuit tongue, and fifth printed areas extend from the fourth printed areas and defined on the printed circuit tongue. Accordingly, the present invention enables achieving a connector that is tough and strong, the manufacturing process of which is simple and fast, and the wire layout is simple.

5 Claims, 14 Drawing Sheets

CONNECTOR

BACKGROUND OF THE INVENTION (a) Field of the Invention

The present invention provides a connector, and more particularly provides a connector that is tough and strong, the manufacturing process is simple and fast, and the wire layout is simple.

(b) Description of the Prior Art

In recent years, technical progress enabled the development of all kinds of digital electronic products to facilitate the lives of people, such as digital cameras, digital video cameras, digital personal stereos, PDAs (Personal Digital Assistants), mobile phones, notebook computers, and so on. And, when using these types of digital electronic products, a storage device is required to store photographs, music, movies or software, and so on, in the form of digital data files. In addition, a connector is primarily used to establish a connection relation between the aforementioned electronic devices, and the use of connectors on current circuit boards is already extremely common, such as the various forms of connector ports, which are all completed via connectors. Circuit boards of all types of electronic products, including familiar devices such as computer motherboards, mobile phone circuit boards, and the like, are all equipped with connectors enabling connection with external devices, thereby enabling mutual connection between electronic products and data exchange therebetween, or connection to the Internet, and so on.

Taking a connector as an example, the manufacturing process of a general connector is considerably complex, such as the wire layout and circuit positioning. Moreover, assembly is also complicated, and deformation of the connector easily occurs with long term usage (inserting, pulling out) by the user.

Many kinds of methods are adopted to connect terminals joined to a base plate (tongue) of a connector to a motherboard, hence, it is the strong desire of the inventor and manufacturers engaged in related art and purpose of the present invention to research and improve the aforementioned prior art to provide a connector with variability, and which reduces the manufacturing process and costs.

SUMMARY OF THE INVENTION

A primary objective of the present invention lies in providing a printed circuit tongue, one surface of which is defined with a plurality of first printed areas and second printed areas arranged side by side thereon. Elastic terminal pieces extend from the first printed areas towards one end of the printed circuit tongue and assembled thereat, while third printed areas similarly extend from the second printed areas towards the end of the printed circuit tongue and defined thereat. Furthermore, fourth printed areas corresponding to the second printed areas are defined on another surface of the printed circuit tongue, and fifth printed areas extend from the fourth printed areas towards one end of the printed circuit tongue and defined thereat. In which, the elastic terminal pieces are USB 2.0 terminal interfaces, and the third printed areas and the elastic terminal pieces are USB 3.0 interfaces. In addition, the fifth printed areas are E-SATA (External-Serial Advanced Serial Attachment) interfaces. Accordingly, access to different interfaces can be implemented when a user inserts a connector, thereby achieving practical advancement of the connector in the manufacturing of the printed circuit tongue, which not only provides three different interfaces, but is also tough and strong, the manufacturing process is simple and fast, and the wire layout is simple.

A second objective of the present invention lies in defining one surface of a printed circuit tongue with a plurality of first printed areas and second printed areas arranged side by side thereon. The first printed areas and the second printed areas are joined to a plurality of terminals, and one end of each of the terminals is defined with a connecting portion which mutually connects the respective printed areas. The terminals are respectively defined with a first bent portion close to the area of the connecting portion. A second bent portion is further defined by extending from the first bent portion; moreover, a third bent portion further extends from the second bent portion and defined thereat. Accordingly, practical advancement is achieved using art that provides terminals with different bent portions enabling a printed circuit tongue to be provided with a multitude of connecting methods.

Yet another objective of the present invention lies in also enabling a printed circuit tongue to be used in USB (Universal Serial Bus) and E-SATA (External-Serial Advanced Serial Attachment) two-in-one connectors, HDMI (High-Definition Multimedia Interface) and display port two-in-one connectors, USB 2.0 connectors and USB 3.0 connectors, E-SATA connectors, HDMI connectors, display port connectors, and the like.

Furthermore, a partial structure of the present invention is a shared standard for USB connectors, E-SATA connectors, HDMI connectors, display port connectors, and the like.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
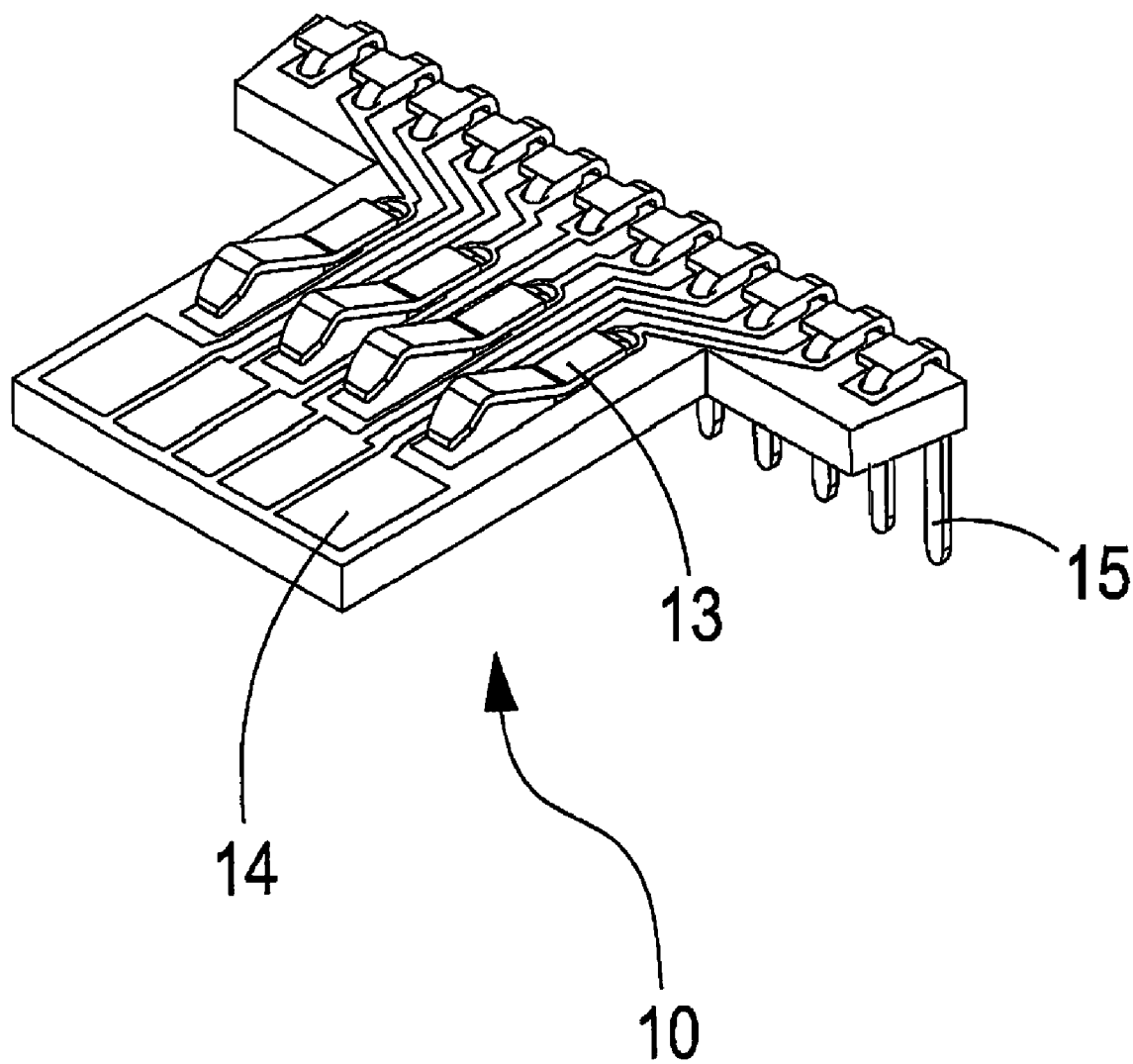
FIG. 1 is a first elevational view of a preferred embodiment of the present invention.
Figure 2:
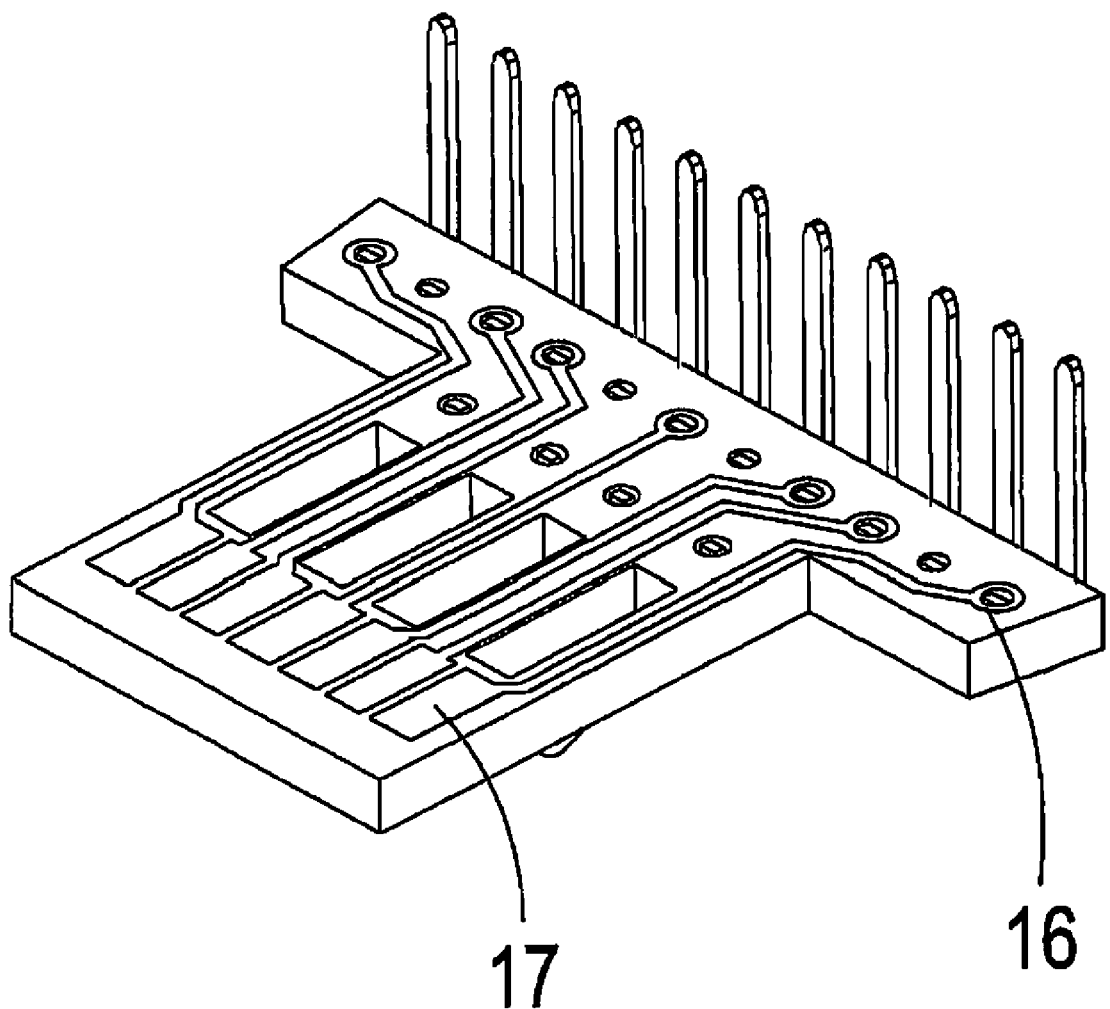
FIG. 2 is a second elevational view of the preferred embodiment of the present invention.
Figure 3:
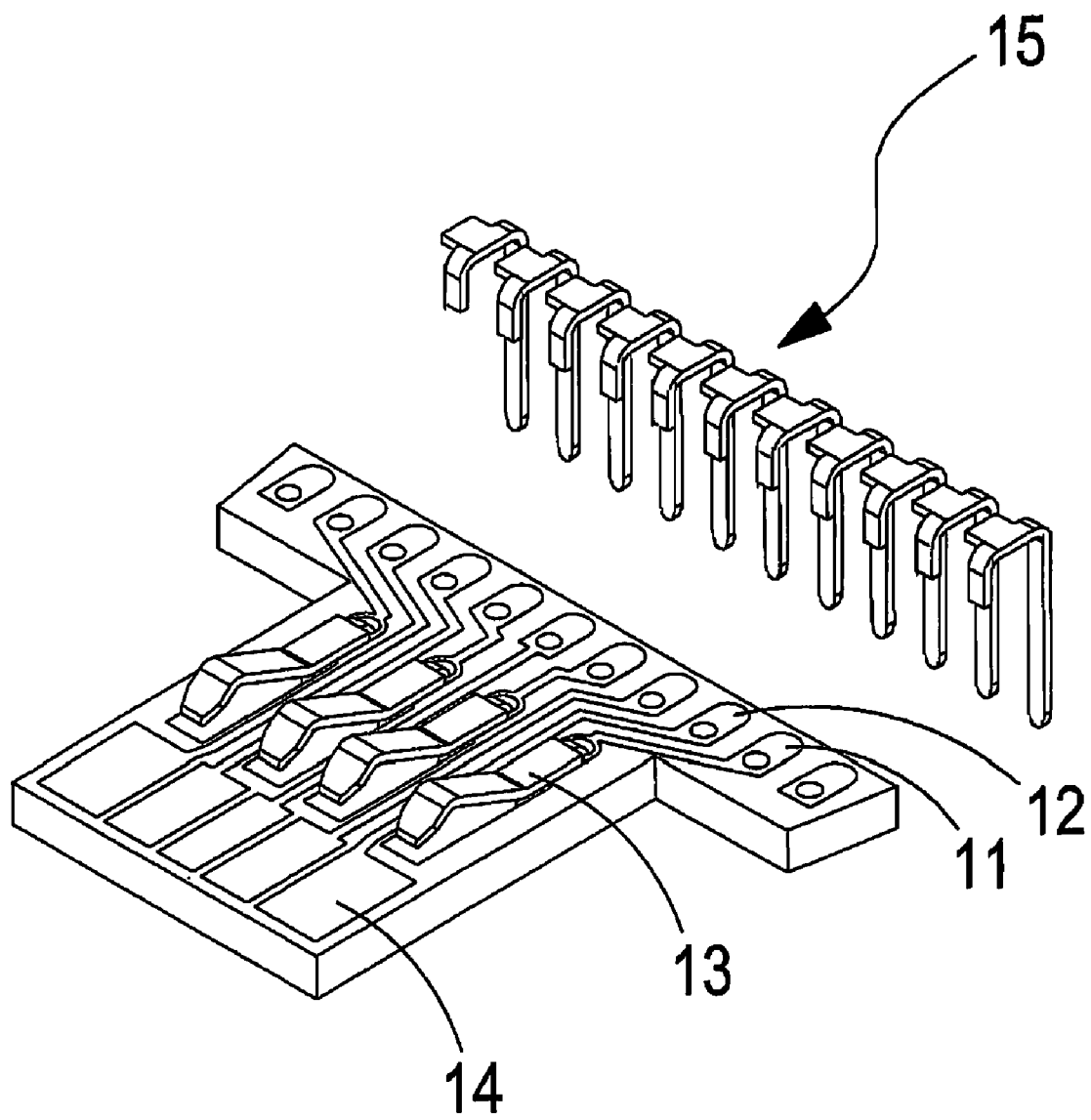
FIG. 3 is an exploded elevational view of the preferred embodiment of the present invention.

Referring to FIG. 1, FIG. 2 and FIG. 3, which show first and second elevational views and an exploded elevational view respectively of a preferred embodiment of the present invention, and it can be clearly seen from the drawings that the present invention comprises a printed circuit tongue 10, and one surface of the printed circuit tongue 10 is defined with a plurality of first printed areas 11 and second printed areas 12 arranged side by side thereon. Elastic terminal pieces 13 (USB (Universal Serial Bus) 2.0 terminal interfaces) extend from the first printed areas 11 towards one end of the printed circuit tongue 10 and assembled thereat, while third printed areas 14 similarly extend from the second printed areas 12 towards the end of the printed circuit tongue 10 and defined thereat; the third printed areas 14 and the elastic terminal pieces 13 are USB 3.0 interfaces. Terminals 15 are joined to the first printed areas 11 and the second printed areas 12. Furthermore, fourth printed areas 16 corresponding to the second printed areas 12 are defined on another surface of the printed circuit tongue 10, and fifth printed areas 17 extend from the fourth printed areas 16 towards one end of the printed circuit tongue 10 and defined thereat. The fifth printed areas 17 are E-SATA (External-Serial Advanced Serial Attachment) interfaces.

Figure 4:
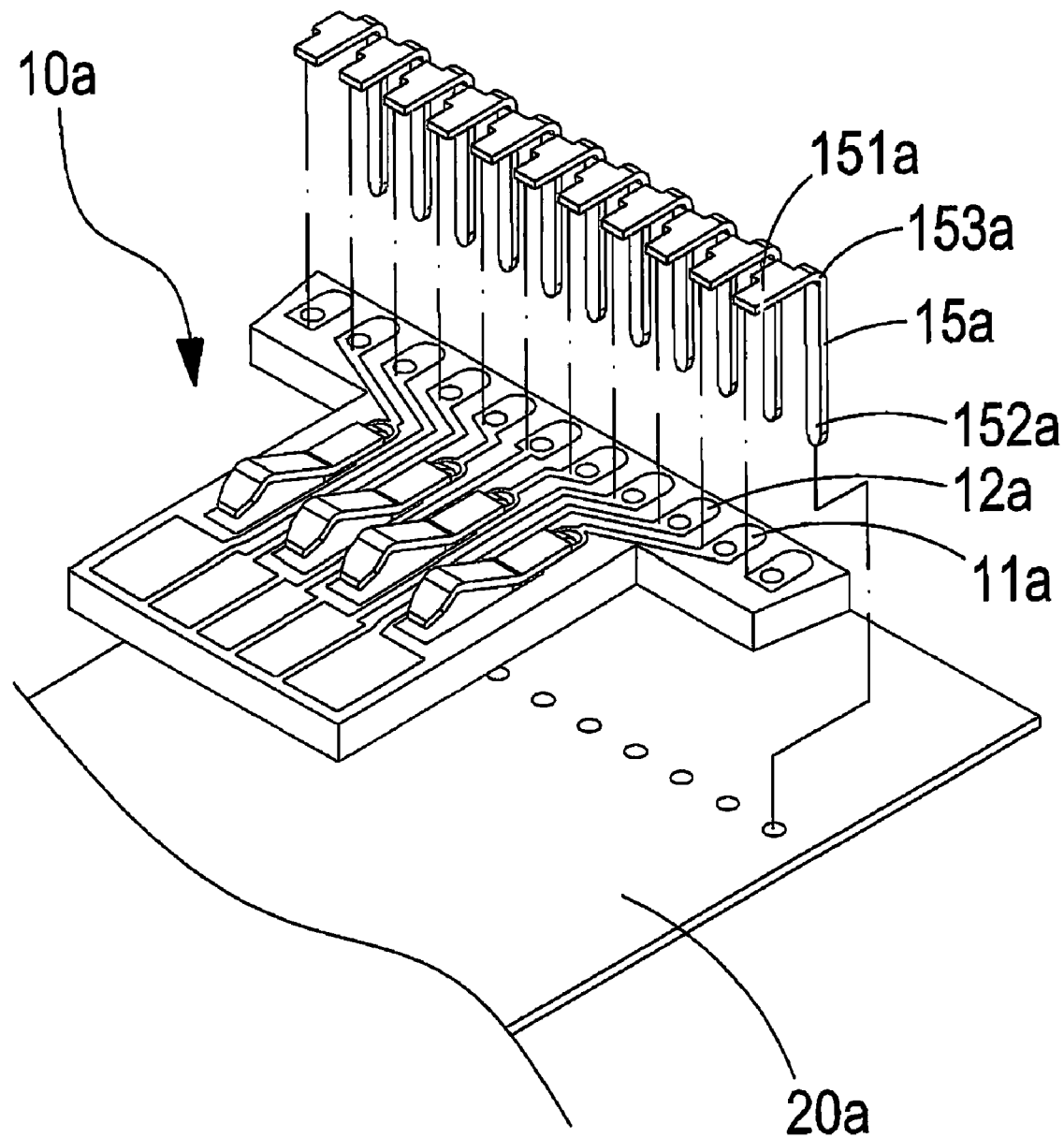
FIG. 4 is an implementation schematic view of a first preferred embodiment of terminals according to the present invention.

Referring to FIG. 4, which shows an implementation schematic view of a first preferred embodiment of terminals of the present invention, and it can be clearly seen from the drawing that one surface of a printed circuit tongue 10a is defined with a plurality of first printed areas 11a and second printed areas 12a arranged side by side thereon. The first printed areas 11a and the second printed areas 12a are joined to a plurality of terminals 15a, and one end of each of the terminals 15a is defined with a connecting portion 151a which mutually connects the respective first printed area 11a and the second printed area 12a. The terminals 15a are respectively defined with a first bent portion 153a close to the area of the connecting portion 151a, and the first bent portions 153a are bent downwardly 90 degrees. Moreover, the terminals 15a are respectively defined with a joining portion 152a located at another end of the connecting portion 151a, and the joining portions 152a are connected to an exterior base plate 20a. The joining portions 152a are used to enable inserted disposition in the exterior base plate 20a.

Figure 5:
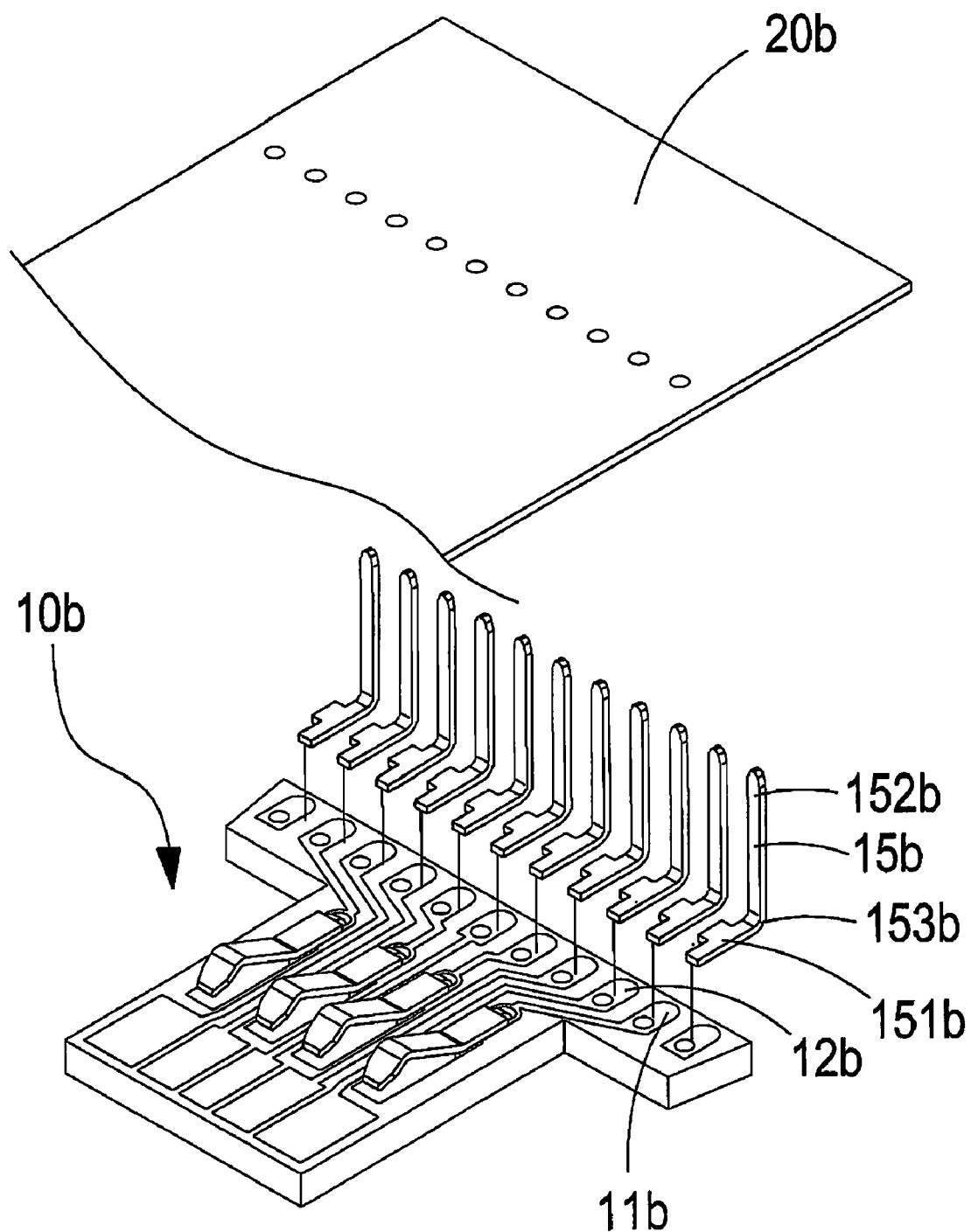
FIG. 5 is an implementation schematic view of a second preferred embodiment of the terminals according to the present invention.

Referring to FIG. 5, which shows an implementation schematic view of a second preferred embodiment of terminals of the present invention, and it can be clearly seen from the drawing that one surface of a printed circuit tongue 10b is defined with a plurality of first printed areas 11b and second printed areas 12b arranged side by side thereon. The first printed areas 11b and the second printed areas 12b are joined to a plurality of terminals 15b, and one end of each of the terminals 15b is defined with a connecting portion 151b which mutually connects the respective first printed area 11b and the second printed area 12b. The terminals 15b are respectively defined with a first bent portion 153b close to the area of the connecting portion 151b, and the first bent portions 153b are bent upwardly 90 degrees. Moreover, the terminals 15b are respectively defined with a joining portion 152b located at another end of the connecting portion 151b, and the joining portions 152b are connected to an exterior base plate 20b. The joining portions 152b are used to enable inserted disposition in the exterior base plate 20b.

Figure 6:
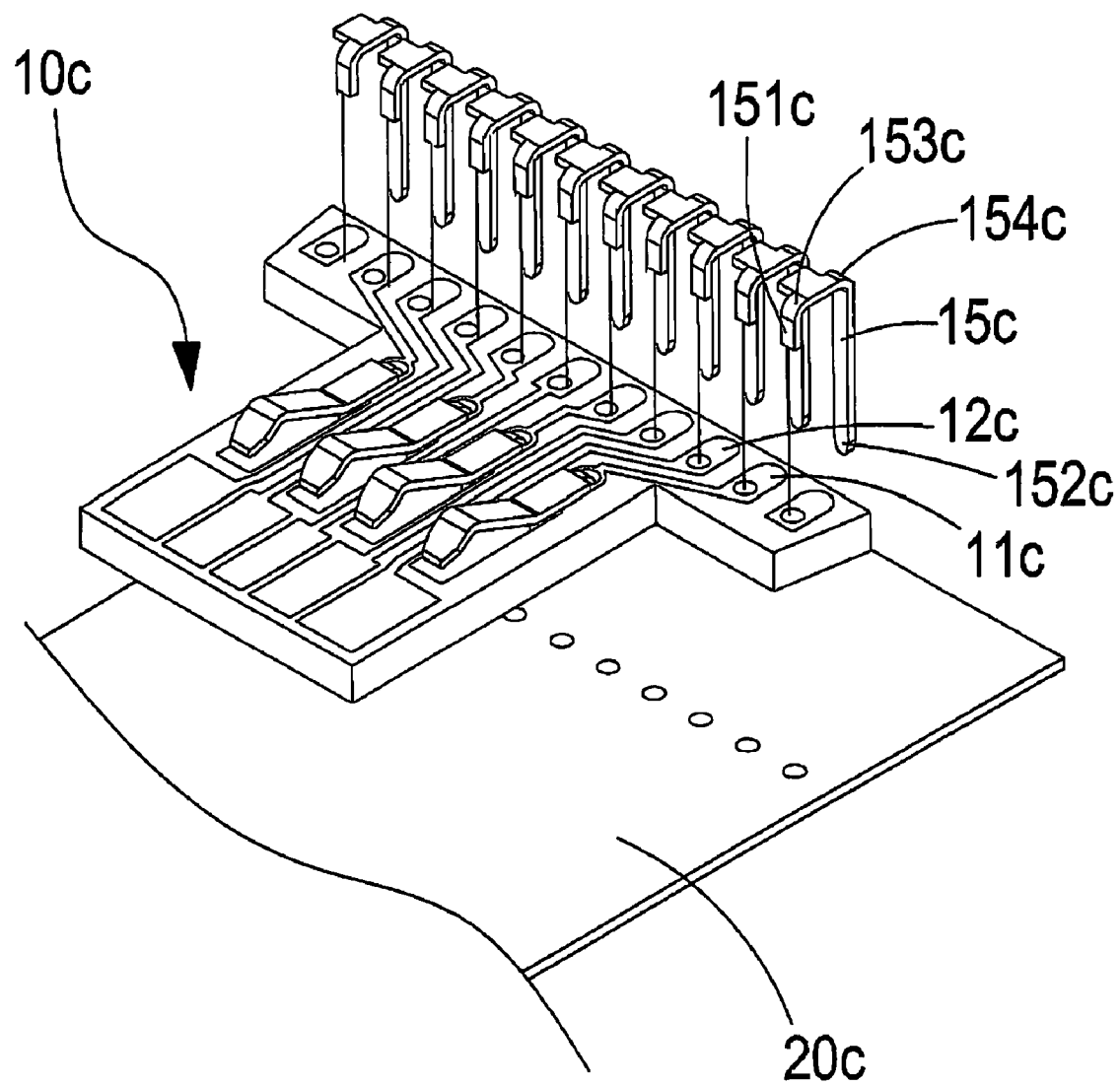
FIG. 6 is an implementation schematic view of a third preferred embodiment of the terminals according to the present invention.

Referring to FIG. 6, which shows an implementation schematic view of a third preferred embodiment of terminals of the present invention, and it can be clearly seen from the drawing that one surface of a printed circuit tongue 10c is defined with a plurality of first printed areas 11c and second printed areas 12c arranged side by side thereon. The first printed areas 11c and the second printed areas 12c are joined to a plurality of terminals 15c, and one end of each of the terminals 15c is defined with a connecting portion 151c which mutually connects the respective first printed area 11c and the second printed area 12c. The terminals 15c are respectively defined with a first bent portion 153c (which can be further bent horizontally) close to the area of the connecting portion 151c. A second bent portion 154c is further defined by extending from the first bent portion 153c, and the second bent portions 154c are bent downwardly 90 degrees. Moreover, the terminals 15c are respectively defined with a joining portion 152c located at another end of the connecting portion 151c, and the joining portions 152c are connected to an exterior base plate 20c. The joining portions 152c are used to enable inserted disposition in the exterior base plate 20c.

Figure 7:
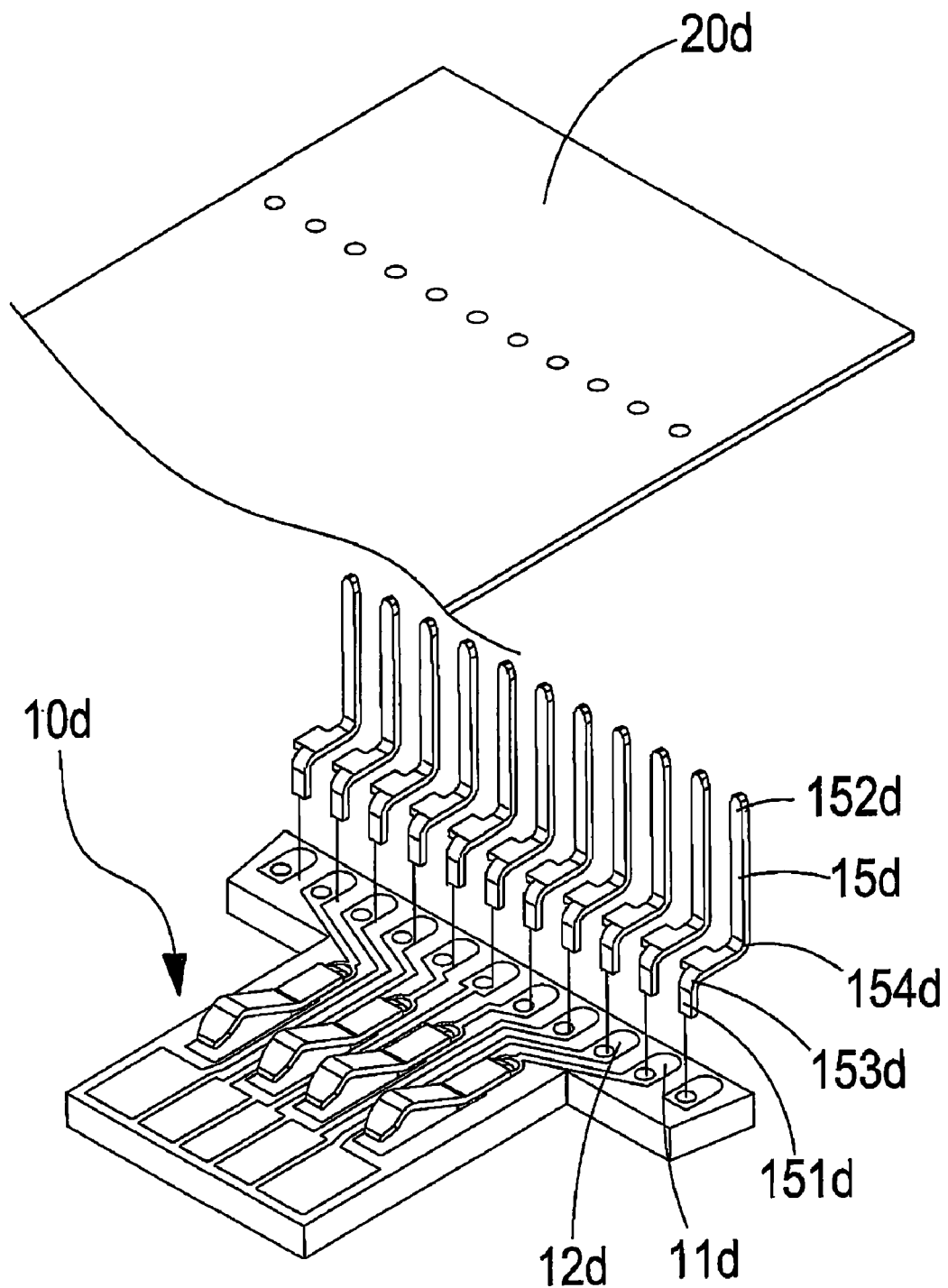
FIG. 7 is an implementation schematic view of a fourth preferred embodiment of the terminals according to the present invention.

Referring to FIG. 7, which shows an implementation schematic view of a fourth preferred embodiment of terminals of the present invention, and it can be clearly seen from the drawing that one surface of a printed circuit tongue 10d is defined with a plurality of first printed areas 11d and second printed areas 12d arranged side by side thereon. The first printed areas 11d and the second printed areas 12d are joined to a plurality of terminals 15d, and one end of each of the terminals 15d is defined with a connecting portion 151d which mutually connects the respective first printed area 11d and the second printed area 12d. The terminals 15d are respectively defined with a first bent portion 153d (which can be further bent horizontally) close to the area of the connecting portion 151d, and the second bent portions 154d are bent upwardly 90 degrees. Moreover, the terminals 15d are respectively defined with a joining portion 152d located at another end of the connecting portion 151d, and the joining portions 152d are connected to an exterior base plate 20d. The joining portions 152d are used to enable inserted disposition in the exterior base plate 20d.

Figure 8:
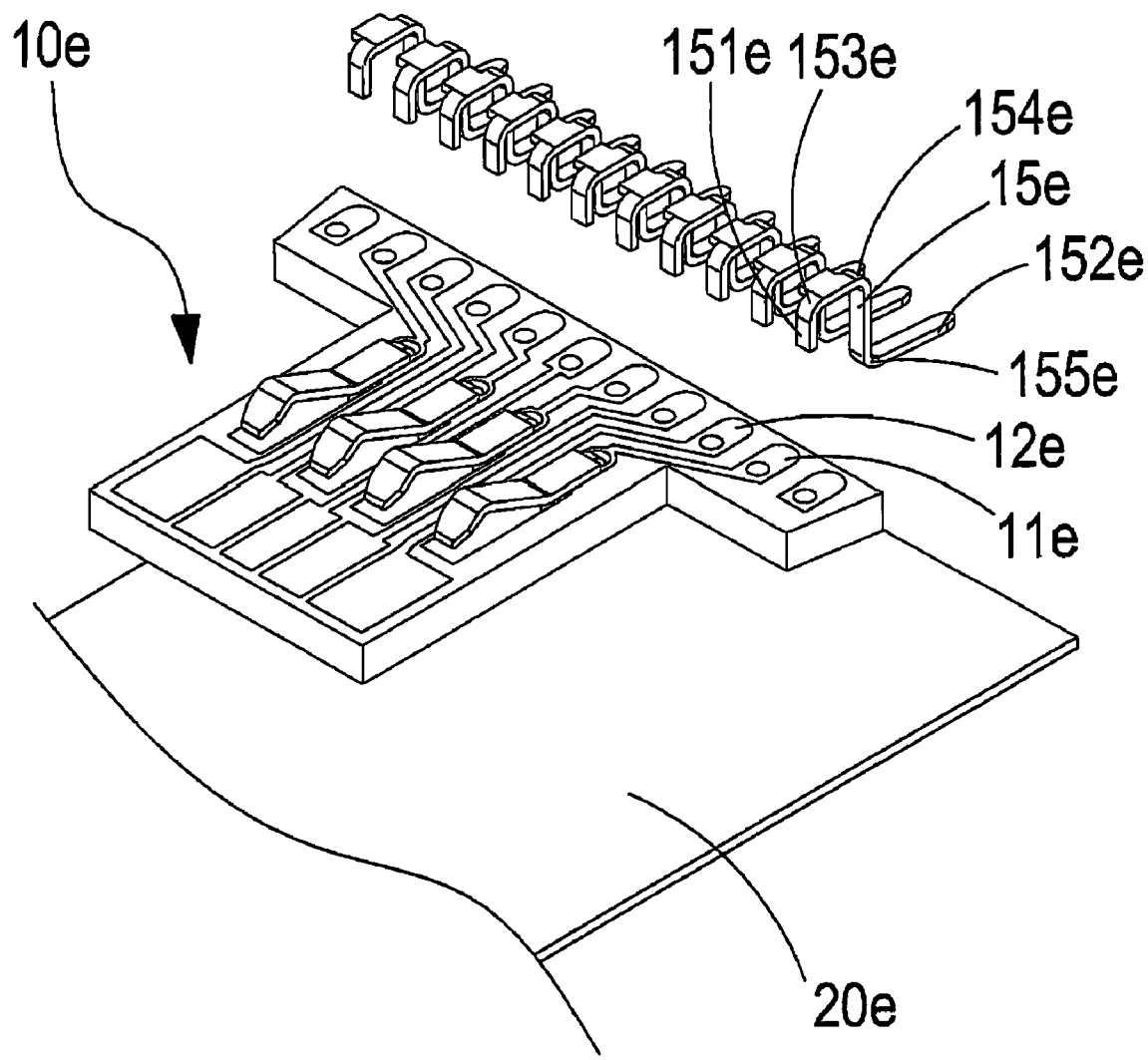
FIG. 8 is an implementation schematic view of a fifth preferred embodiment of the terminals according to the present invention.

Referring to FIG. 8, which shows an implementation schematic view of a fifth preferred embodiment of terminals of the present invention, and it can be clearly seen from the drawing that one surface of a printed circuit tongue 10e is defined with a plurality of first printed areas 11e and second printed areas 12e arranged side by side thereon. The first printed areas 11e and the second printed areas 12e are joined to a plurality of terminals 15e, and one end of each of the terminals 15e is defined with a connecting portion 151e which mutually connects the respective first printed area 11e and the second printed area 12e. The terminals 15e are respectively defined with a first bent portion 153e (which can be further bent horizontally) close to the area of the connecting portion 151e, and a second bent portion 154e (which can be further bent downwardly 90 degrees) further extends from each of the first bent portions 153e and defined thereat. A third bent portion 155e further extends from the second bent portion 154e and defined thereat, and the third bent portions 155e are bent horizontally 90 degrees. Moreover, the terminals 15e are respectively defined with a joining portion 152e located at another end of the connecting portion 151e, and the joining portions 152e are connected to an exterior base plate 20e. The joining portions 152e are used to enable inserted disposition in the exterior base plate 20e.

Figure 9:
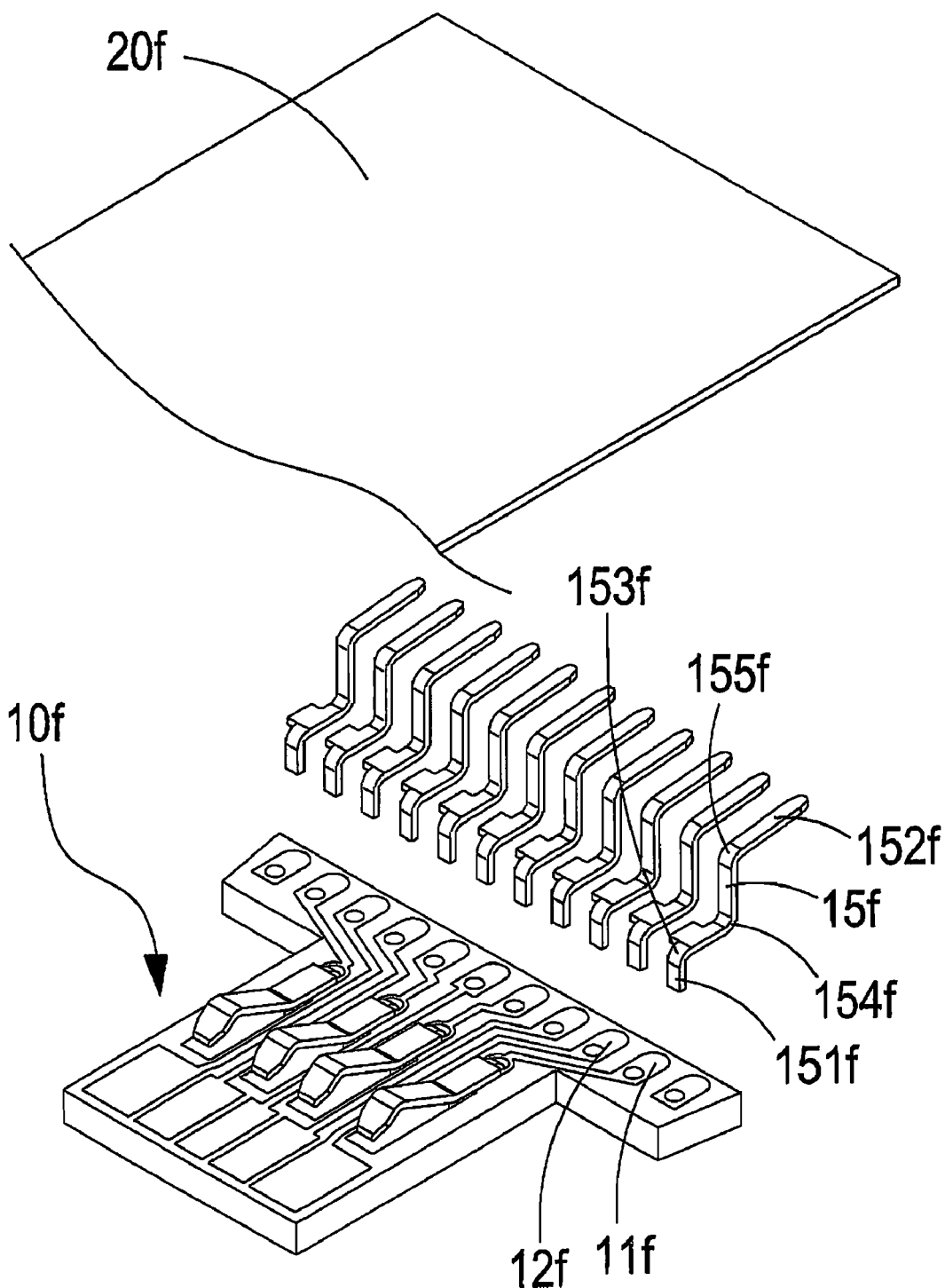
FIG. 9 is an implementation schematic view of a sixth preferred embodiment of the terminals according to the present invention.

Referring to FIG. 9, which shows an implementation schematic view of a sixth preferred embodiment of terminals of the present invention, and it can be clearly seen from the drawing that one surface of a printed circuit tongue 10*f* is defined with a plurality of first printed areas 11*f* and second printed areas 12*f* arranged side by side thereon. The first printed areas 11*f* and the second printed areas 12*f* are joined to a plurality of terminals 15*f*, and one end of each of the terminals 15*f* is defined with a connecting portion 151*f* which mutually connects the respective first printed area 11*f* and the second printed area 12*f*. The terminals 15*f* are respectively defined with a first bent portion 153*f* (which can be further bent horizontally) close to the area of the connecting portion 151*f*, and a second bent portion 154*f* (which can be further bent upwardly 90 degrees) further extends from each of the first bent portions 153*f* and defined thereat. A third bent portion 155*f* further extends from each of the second bent portions 154*f* and defined thereat, and the third bent portions 155*f* are bent horizontally 90 degrees. Moreover, the terminals 15*f* are respectively defined with a joining portion 152*f* located at another end of the connecting portion 151*f*, and the joining portions 152*f* are connected to an exterior base plate 20*f*. The joining portions 152*f* are used to enable inserted disposition in the exterior base plate 20*f*.

Figure 10:
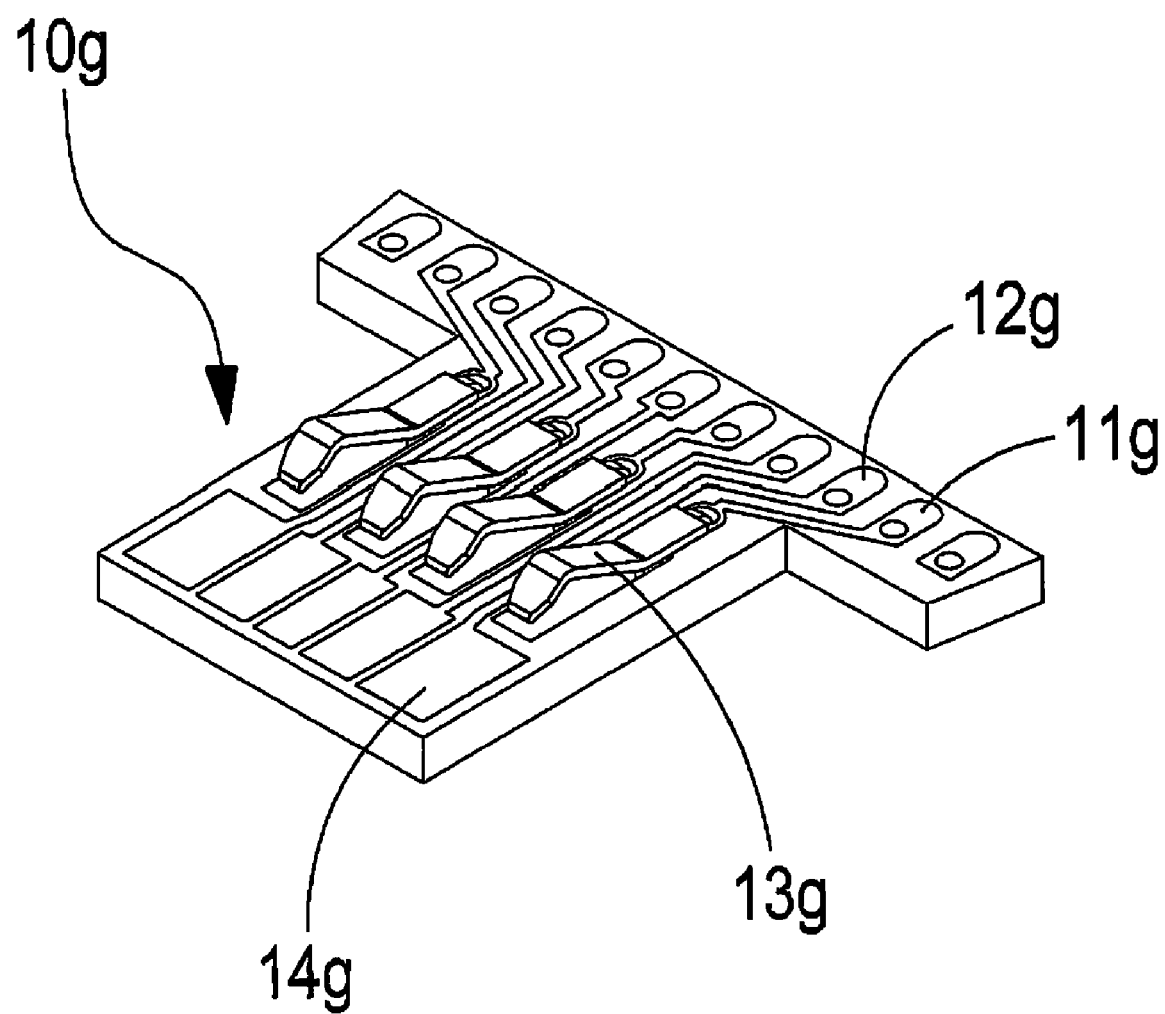
FIG. 10 is a first implementation elevational view of another preferred embodiment of the printed circuit tongue according to the present invention.
Figure 11:
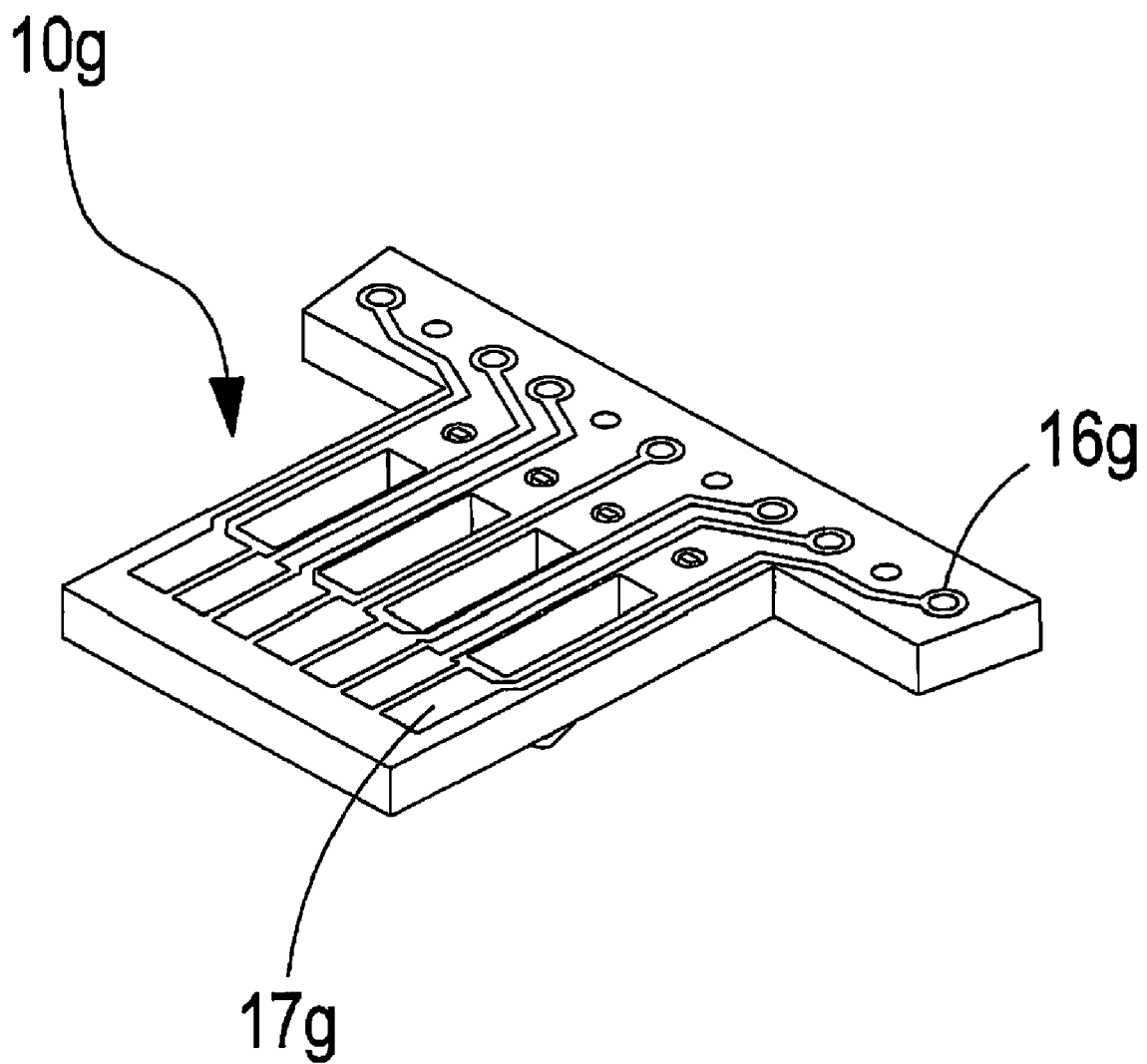
FIG. 11 is a second implementation elevational view of another preferred embodiment of the printed circuit tongue according to the present invention.

Referring to FIG. 10 and FIG. 11, which show first and second implementation elevational views of another preferred embodiment of a printed circuit tongue of the present invention, and it can be clearly seen from the drawings that the connector primarily comprises a printed circuit tongue 10*g*, and one surface of the printed circuit tongue 10*g* is defined with a plurality of first printed areas 11*g* and second printed areas 12*g* arranged side by side thereon. Elastic terminal pieces 13*g* (the elastic terminal pieces 13*g* are USB 2.0 terminal interfaces) extend from the first printed areas 11*g* towards one end of the printed circuit tongue 10*g* and assembled thereat, while third printed areas 14*g* similarly extend from the second printed areas 12*g* towards the end of the printed circuit tongue 10*g* and defined thereat. The third printed areas 14*g* and the elastic terminal pieces 13*g* are USB 3.0 interfaces. Furthermore, fourth printed areas 16*g* corresponding to the second printed areas 12*g* are defined on another surface of the printed circuit tongue 10*g*, and fifth printed areas 17*g* extend from the fourth printed areas 16*g* towards one end of the printed circuit tongue 10*g* and defined thereat. The fifth printed areas 17*g* are E-SATA interfaces.

Figure 12:
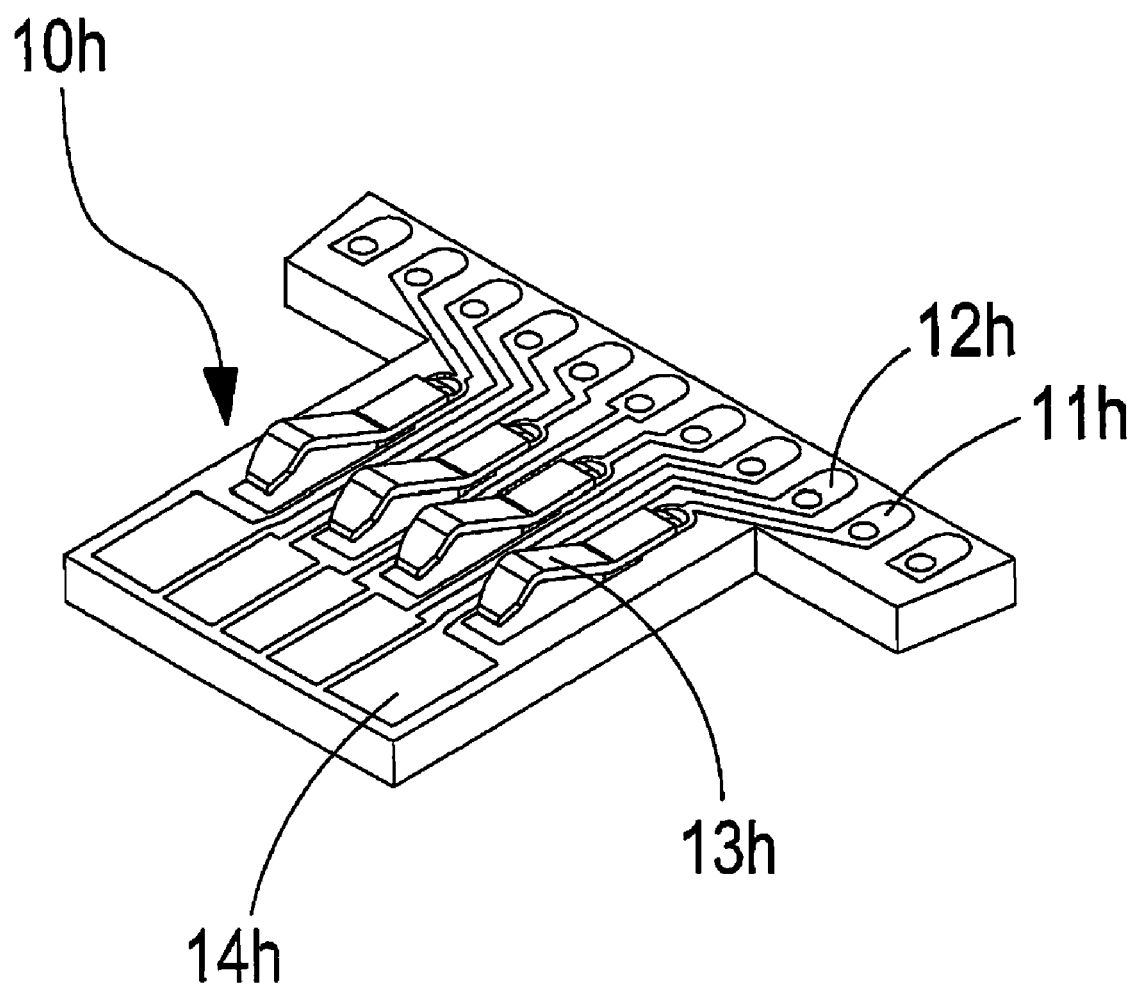
FIG. 12 is an implementation schematic view of yet another preferred embodiment of the present invention.

Referring to FIG. 12, which shows an implementation schematic view of another preferred embodiment of the present invention, and it can be clearly seen from the drawing that the connector is structured from a printed circuit tongue 10*h*, and the printed circuit tongue 10*h* comprises a plurality of first printed areas 11*h* and second printed areas 12*h* arranged side by side on the printed circuit tongue 10*h*. Elastic terminal pieces 13*h* extend from the first printed areas 11*h* towards one end of the printed circuit tongue 10*h* and assembled thereat, while third printed areas 14*h* similarly extend from the second printed areas 12*h* towards the end of the printed circuit tongue 10*h* and defined thereat. The elastic terminal pieces 13*h* are USB 2.0 terminal interfaces, and the third printed areas 14*h* and the elastic terminal pieces 13*h* are USB 3.0 interfaces.

Figure 13:
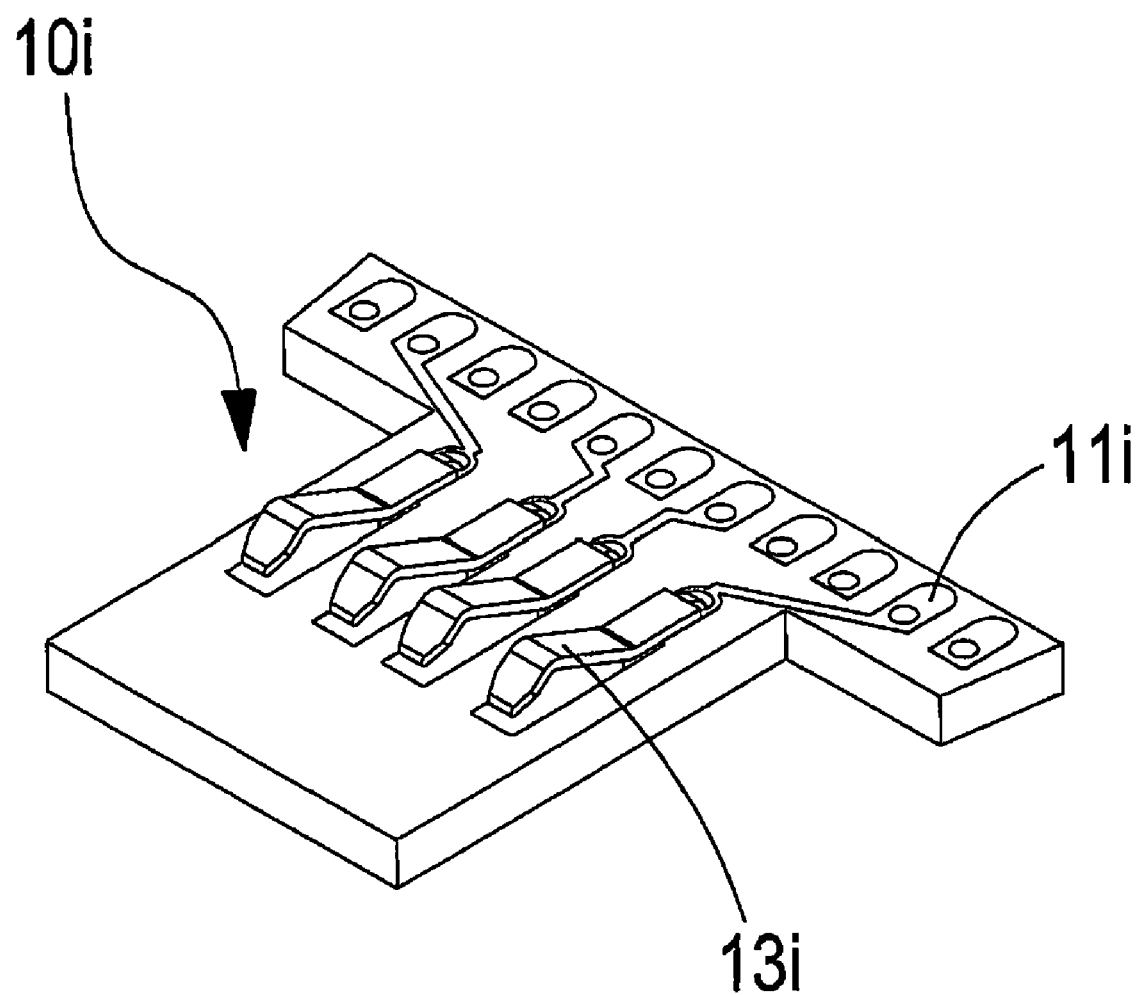
FIG. 13 is a first implementation schematic view of yet another preferred embodiment of the present invention.
Figure 14:
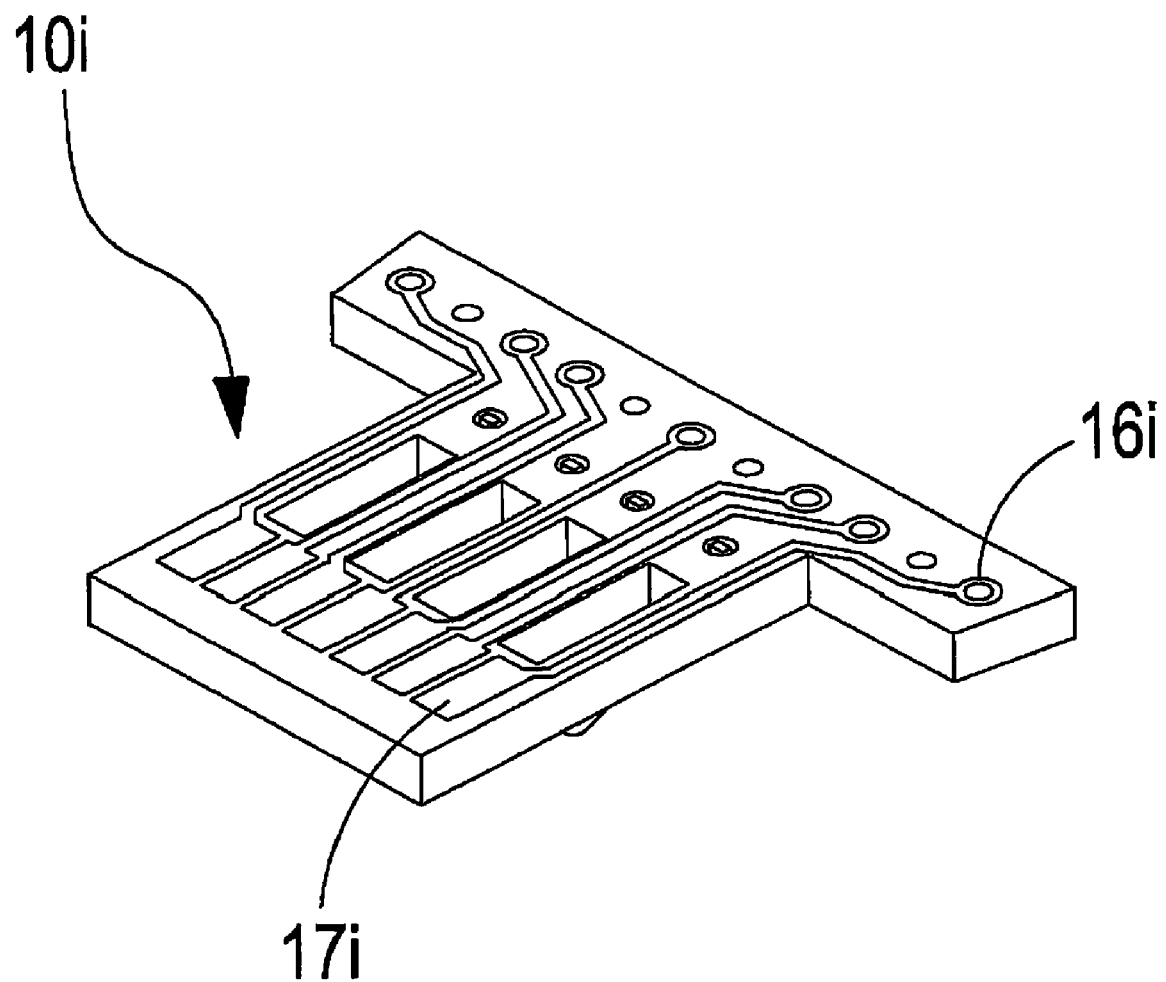
FIG. 14 is a second implementation schematic view of yet another preferred embodiment of the present invention.

Referring to FIG. 13 and FIG. 14, which show first and second implementation schematic views of yet another preferred embodiment of the present invention, and it can be clearly seen from the drawings that the connector is structured from a printed circuit tongue 10*i*, and the printed circuit tongue 10*i* comprises a plurality of first printed areas 11*i* orderly arranged in parallel on one surface of the printed circuit tongue 10*i*. Elastic terminal pieces 13*i* (the elastic terminal pieces 13*i* are USB 2.0 terminal interfaces) extend from the first printed areas 11*i* towards one end of the printed circuit tongue 10*i* and assembled thereat. Another surface of the printed circuit tongue 10*i* is defined with fourth printed areas 16*i*, and fifth printed areas 17*i* extend from the fourth printed areas 16*i* towards one end of the printed circuit tongue 10*i* and defined thereat. The fifth printed areas 17*i* are E-SATA interfaces.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A connector comprising: a printed circuit tongue, wherein one surface of the printed circuit tongue is defined with a plurality of first printed areas and second printed areas arranged side by side thereon, elastic terminal pieces extend from the first printed areas towards one end of the printed circuit tongue and assembled thereat, and third printed areas similarly extend from the second printed areas towards the end of the printed circuit tongue and defined thereat; a plurality terminals joined to the first printed areas and the second printed areas; and fourth printed areas defined on another surface of the printed circuit tongue corresponding to the second printed areas, fifth printed areas extend from the fourth printed areas towards one end of the printed circuit tongue and defined thereat, ends of the terminals being respectively defined with a connecting portion which mutually connects the respective first printed area and the second printed area, the terminal being respectively defined with a first bent portion close to the connecting portion, a second bent portion further extending from the first bent portion, and a third bent portion further extending from the second bent portion.

2. The connector according to claim 1, wherein the elastic terminal pieces are USB (Universal Serial Bus) 2.0 terminal interfaces.

3. The connector according to claim 1, wherein the third printed areas and the elastic terminal pieces are USB 3.0 interfaces.

4. The connector according to claim 1, wherein the fifth printed areas are E-SATA (External-Serial Advanced Serial Attachment) interfaces.

5. The connector according to claim 1, wherein the terminals are respectively defined with a joining portion located at another end of the connecting portion, and the joining portions are connected to an exterior base plate.

* * * * *